(12) United States Patent
Joo et al.

(10) Patent No.: US 6,462,344 B1
(45) Date of Patent: Oct. 8, 2002

(54) X-RAY IMAGE DETECTOR AND A METHOD FOR FABRICATING THE SAME

(75) Inventors: Insu Joo; Yuho Jung, both of Yongbuk (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/534,220

(22) Filed: Mar. 24, 2000

(30) Foreign Application Priority Data

Mar. 25, 1999 (KR) ............................................. 99-10397

(51) Int. Cl.$^7$ ................................................. G01T 1/24
(52) U.S. Cl. ........................... 250/370.09; 250/370.09; 250/367; 250/363.2; 250/370.11; 250/385.1
(58) Field of Search ........................... 250/370.09, 367, 250/363.2, 370.11, 385.1

(56) References Cited

U.S. PATENT DOCUMENTS

| | | |
|---|---|---|
| 5,498,880 A | 3/1996 | Lee et al. |
| 5,648,674 A | 7/1997 | Weisfield et al. |
| 5,869,837 A * | 2/1999 | Huang .................... 250/370.09 |
| 6,075,248 A * | 6/2000 | Jeromin et al. ........ 250/370.09 |

* cited by examiner

Primary Examiner—Constantine Hannaher
Assistant Examiner—Andrew Israel
(74) Attorney, Agent, or Firm—McKenna Long & Aldridge LLP

(57) ABSTRACT

An X-ray image detector includes a photoelectric conversion part providing electric charges in accordance with the received amount of light; a charge storage part (storage capacitor) having a first storage electrode, a dielectric layer deposited on the first storage electrode, a second storage electrode on the dielectric layer and a pixel electrode in contact with total surface of the second storage electrode and collecting electric charges produced in the photoelectric conversion part; and a switching part controlling release of the electric charges stored in the storage capacitor and a method for fabricating the same. The x-ray image detector has a reduced "off" electric current due to a reduced leakage current of the TFT, and the capacity of storage capacitor is increased. Also, the X-ray image detector may be manufactured with a higher yield, due to reduced electrical shorts between the first and second storage electrodes.

17 Claims, 4 Drawing Sheets

X-RAY IMAGE DETECTOR AND A METHOD FOR FABRICATING THE SAME

CROSS REFERENCES TO RELATED APPLICATIONS

This application claims the benefit of Korean Patent Application No. 1999-10397, filed on Mar. 25, 1999, which is hereby incorporated by reference for all purposes as if fully set forth herein.

BACKGROUND OF THE INVENTION

1. Field of the Invention

The present invention relates to an X-ray image detector, and more particularly to an X-ray image detector fabricated utilizing a Thin Film Transistor (TFT) array process and a method for fabricating the same.

2. Description of Related Art

The widely used X-ray detection method for medical diagnosis is such that an X-ray detecting film is used to produce a photograph and some predetermined printing procedure is required to obtain the result.

However, digital X-ray detectors employing TFTs have been developed recently due to the development of semiconductor technology. This X-ray image detector has an advantage that a real time result for diagnosis can be obtained immediately after photographing because it uses a TFT as a switch.

The above-described X-ray image detector and a TFT-LCD have many characteristics in common in Table 1.

TABLE 1

|   | X-ray image detector | TFT-LCD |
|---|---|---|
| USE | X-ray detection | Display of images |
| PANEL COMPOSITION | TFT panel + photoconductive film + color filter Upper electrode | TFT + liquid crystal + |
| USE OF TFT | Switch for releasing signals | Switch for applying signals |
| DATA LINE | X-ray signal detection Line | Application of signal voltages to pixels |
| CAPACITY OF STORAGE CAPACITOR | More than 2.1 pF | 0.2 to 0.3 pF |
| MATERIAL OF STORAGE ELECTRODE | ITO/ITO (indium tin oxide) | A metal/ITO |
| OPENING RATIO | 85% | 60 to 70% |

As shown in Table 1, the opening ratio of an X-ray image detector is larger than that of a TFT-LCD by 15 to 25%. This is because the metal line of a TFT-LCD is covered with black matrix to prevent the deterioration of picture quality. However, in an X-ray image detector, as the total surface of the ITO pixel electrode corresponds to the opening part, its opening ratio is superior to that of a TFT-LCD.

FIG. 1 is a schematic cross-sectional view illustrating the structure and operation of X-ray image detector 100 which comprises lower substrate 1, thin film transistor 3, storage capacitor 10, pixel electrode 12, photoconductive film 2, protection film 20, conductive electrode 24 and high voltage D.C. (direct current) power supply 26.

Photoconductive film 2 produces internal electric signals, i.e. pairs of electron (e) and holes (h), in proportion to the strength of external signals such as incident electromagnetic waves or magnetic waves. The photoconductive film 2 serves as a conversion to detect external signals, particularly X-rays, and convert them to electric signals. Electron-hole pairs (6) are gathered in the form of electric charges at pixel electrode 12 located beneath the photoconductive film 2 by a voltage ($E_v$) applied to conductive electrode 24 by the high voltage D.C. power supply 26, and then is stored in storage capacitor 10 formed in connection with a common electrode grounded externally. Charges stored in the storage capacitor 10 are transferred by TFT 3, controlled externally, to an external image display device and forms X-ray images.

In an X-ray image detector, to detect and convert even a weak X-ray signal into electric charges, it is required to decrease the number of electric charges trapped in the photoconductive film 2, and to decrease the current in non-vertical directions by means such as applying a high voltage (more than $10V/\mu m$) in the vertical directions between conductive electrode 24 and pixel electrode 12.

Electric charges in the photoconductive film 2 produced by X-ray energy are trapped and gathered on a protection film (not illustrated),which protects the channel part of the TFT 3, as well as on the pixel electrode. This electric charges trapped and gathered induce electric charge into the channel region in the upper part of TFT 3, producing a high leakage current even when TFT 3 is in an "off" state, thus inhibiting switching operation of TFT 3.

Moreover, electric signals stored in the storage capacitor 10 are discharged externally due to the high leakage current in the "off" state, as a result of which, the desired image can not be obtained.

FIG. 2 is a cross-sectional view schematically illustrating a conventional X-ray image detector. U.S. Pat. No. 5,498,880 discloses one example of this kind of structure wherein pixel electrode 12 is extended to cover the upper part of TFT 3, (so called "mushroom structure") to prevent the trapping of electric charges on the upper part of TFT 3, induced from the electric charges produced in photoconductive film 2 by X-ray.

The manufacture of the conventional X-ray image detector will be described hereinafter referring to FIG. 2.

First, substrate 1 is deposited with a metal and patterned to form a gate electrode 31. Then, SiNx is deposited thereon in the thickness of about 100 nm to form a first insulation film 34a. After the formation of film 34a, a transparent conductive material is deposited and patterned to form a first storage electrode 40. ITO (indium tin oxide) is most commonly used as the transparent conductive material.

After forming the first storage electrode 40, second insulation film 34b is formed on the first insulation film 34a and first storage electrode 40. At a predetermined position of the second insulation film 34b on the first storage electrode 40, a contact hole 41 is formed for contact with a ground line 42 that will be formed later.

Thereafter, a source/drain metal material is deposited and patterned to form a source electrode 33, drain electrode 32 and ground line 42. The source/drain metal is usually aluminum which has a low resistance and good deposition properties. Protection layer 46 is formed after the formation of 33, 32 and 42, in order to protect TFT 3.

In the protection layer 46 contact holes are formed on the source electrode 33 for contact with a second storage electrode which will be formed later. Then, the protection layer 46 formed in the upper part of the first storage electrode 40 is etched out except on ground lines 42 for increasing the capacity of the storage capacitors. In the described structure, the practical charging capacity corresponds to the portion labeled $C_{st}$ in FIG. 2. Now, ITO is deposited and patterned to form a second storage electrode 12 which serves as a pixel electrode, and a photoconductive film 2 is formed by deposition on the overall substrate 1. The later procedures are abbreviated here.

In an X-ray image detector adopting the so-called "mushroom structure" as described above, as electric charges produced by X-ray energy gather on the pixel electrode 12 of the storage capacitor, the electric potential of the storage capacitor increases. The increased potential causes an increased capacity of a parasitic capacitor which is formed between the "mushroom" associated with the pixel electrode and TFT 3.

The capacity of a parasitic capacitor is inversely related to the thickness of the protection layer 46 to protect the channel part in the upper part of TFT 3 such that the capacitance increases as the thickness of the protection layer 46 is reduced, inducing a large amount of charges to the channel part, which increases the amount of leakage current even if TFT is in an "off" state and deteriorates its switching operation.

Though the capacity of a parasitic capacitor of TFT 3 may be decreased if the thickness of an organic insulation film used as dielectric material of storage capacitor is increased to more than 1.5 $\mu$m, the rear surface of TFT 3 under an acrylic protection film of the conventional X-ray image detector can have about 1 $\mu$m thickness, which allows increase of leakage current in an "off" state.

Furthermore, second insulation film 34b used as a dielectric of the storage capacitor is formed to be thin with a thickness of about 200 nm in a conventional X-ray image detector 50, the second insulation film may be etched out (overetching) while etching the organic insulation film as protection layer 46. This causes an electrical short between the first and second storage electrodes and accordingly the number of point defects is increased, causing a low yield.

Moreover, because the protection layer 46 in the true storage capacitor is substantially thick, the $C_{st}$ portion is relatively small. To solve the problem, the protection layer 46 is partially etched to form the $C_{st}$, but a satisfactory result has not been obtained because there is a limit in extending the $C_{st}$ by utilizing only part of a total pixel.

SUMMARY OF THE INVENTION

An object of the present invention is to provide an X-ray image detector in which the "off" electric current is decreased by lowering the leakage current of a TFT.

Another object of the present invention is to provide a manufacturing method of an X-ray image detector with high yield by reducing the instances of electrical shorts between gate and source/drain electrodes and storage electrode.

A further object of the present invention is to provide an X-ray image detector with a storage capacitor having an increased capacity.

To achieve the objects, the present invention provides, in one aspect, an X-ray image detector which comprises: a photoelectric conversion part producing electric charges in accordance with a received amount of light; a charge storage part (storage capacitor) comprising a first storage electrode, a dielectric layer deposited on the first storage electrode, a second storage electrode on the dielectric layer, and a pixel electrode in contact with total surface of the second storage electrode and collecting the electric charges produced in the photoelectric conversion part; and a switching part controlling the release of the electric charges stored in the storage capacitor.

In another aspect, the present invention also provides an X-ray image detector which comprises a substrate; a gate electrode formed on the substrate; a first insulation film formed on the substrate and gate electrode; a first storage electrode formed on a predetermined position of the first insulation film; an active layer formed the first insulation film on the gate electrode; a source and drain electrode formed on the active layer; a second insulation film formed on the source and drain electrode and the first storage electrode and having a source contact hole exposing a portion of the source electrode; a second storage electrode formed on the second insulation film; a third insulation film covering a residual part except the second storage electrode and source contact hole; and a pixel electrode formed on the exposed source electrode, second storage electrode and third insulation film.

In another aspect, the present invention also provides a method for fabricating an X-ray image detector, comprising forming a gate electrode on a substrate; forming a first insulation film on the substrate and gate electrode; forming an active layer on a first insulation film on the gate electrode; forming a source electrode and drain electrode on the active layer and forming a ground line at a predetermined position on the first insulation film; forming a first storage electrode which covers the ground line; forming a second insulation film on the first storage electrode, source electrode and drain electrode; forming a second storage electrode on the second insulation film on the first storage electrode; depositing an organic insulation film covering the second insulation film and second storage electrode; patterning the organic film and second insulation film so that a portion of the source electrode and the total second storage electrode may be exposed by etching; forming a pixel electrode in contact with the source electrode and second storage electrode, on the organic insulation film remained after etching; forming a photoconductive film on the pixel electrode; and forming a conductive electrode on the photoconductive film.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Figure 1:
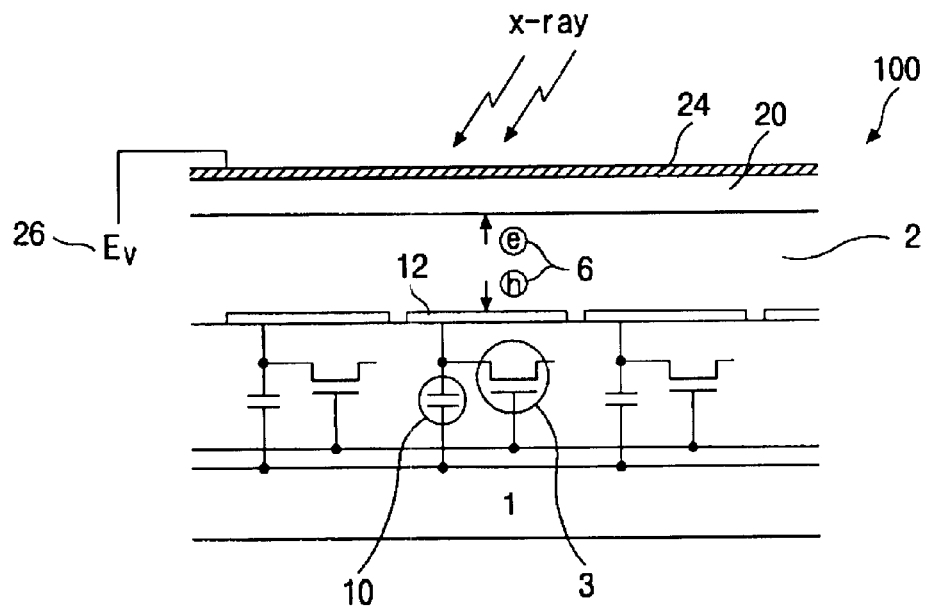
FIG. 1 is a cross-sectional view illustrating the principle of operation of an X-ray image detector.

In one preferred embodiment of the present invention, provided is an X-ray image detector which comprises: a photoelectric conversion part effecting electric charges in accordance with the received amount of X-ray; a charge storage part (storage capacitor) having a first storage electrode, a dielectric layer deposited on the first storage electrode. a second storage electrode on the dielectric layer and a pixel electrode in contact with total surface of the second storage electrode and collecting the electric charges produced in the photoelectric conversion part; and a switching part controlling release of the electric charges stored in the storage capacitor.

The charge storage part also comprises a ground line contacting with the first storage electrode.

The ground line is disposed beneath the first storage electrode.

The photoelectric conversion part further includes a photoconductive film and a conductive electrode.

In another preferred embodiment of the present invention, provided is an X-ray image detector which comprises: a substrate; a gate electrode formed on the substrate; an insulation film formed on the substrate and the gate electrode; a first storage electrode formed on a predetermined position of the first insulation film; an active layer formed on the first insulation film on the gate electrode; a source and drain electrode formed on the active layer; a second insulation film formed on the source and drain electrodes and first storage electrode and having a source contact hole exposing a portion of the source electrode; a second storage electrode formed on the second insulation film; a third insulation film covering the residual part except the second storage electrode and source contact hole; and a pixel electrode formed on the exposed source electrode, the second storage electrode and third insulation film.

The third insulation film is desirably an organic insulation film, especially a material selected from the group consisting of BCB (benzocyclobutene), acrylic resin and polyimide.

Between the first storage electrode and the first insulation film, formed is a ground line.

It is desirable that the pixel electrode is extended to the third insulation film.

In another preferred embodiment of the invention, provided is a method for fabricating an X-ray image detector, comprising forming a gate electrode on a substrate; forming a first insulation film on the substrate and gate electrode; forming an active layer on the first insulation film on the gate electrode; forming a source electrode and drain electrode on the active layer and forming a ground line at a predetermined position on the first insulation film; forming a first storage electrode which covers the ground line; forming a second insulation film on the first storage electrode, source electrode and drain electrode; forming a second storage electrode on the second insulation film on the first storage electrode; depositing an organic insulation film covering the second insulation film and second storage electrode; patterning the organic film and second insulation film so that a portion of the source electrode and the total second storage electrode may be exposed by etching; forming a pixel electrode in contact with the source electrode and second storage electrode, on the remained organic insulation film; forming a photoconductive film on the pixel electrode; and forming a conductive electrode on the photoconductive film.

The photoconductive film is preferably selected from the group consisting of PbO, CdTe, $HgI_2$ and CdSe.

It is desirable that the organic insulation film is selected from the group consisting of BCB (benzocyclobutene), acrylic resin and polyimide.

Figure 3:
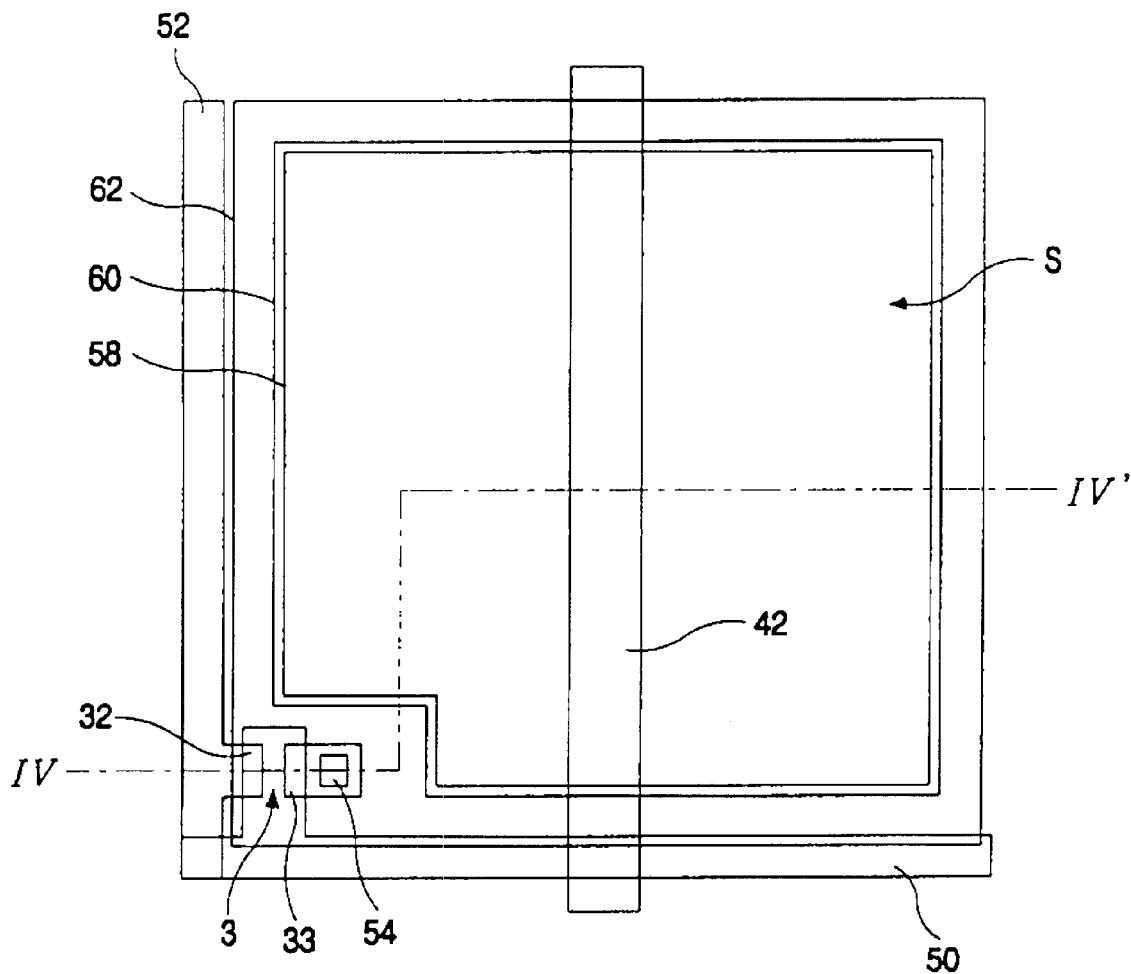
FIG. 3 is a plan view illustrating one pixel of an X-ray image detector in accordance with one embodiment of the present invention.

FIG. 3 is a plan view illustrating one pixel of an X-ray image detector panel according to one embodiment of the invention, which includes a gate line 50 disposed crosswise and a drain line 52 disposed lengthwise. Also, a TFT is formed as a switching element in the area where the gate line 50 crosses the drain line 52, and a ground line 42 is disposed as a common electrode grounded commonly with the adjacent pixels in the lengthwise direction. A first transparent electrode 58 and a second transparent electrode 60 are formed to constitute a storage capacitor (S) and a silicon nitride film (not illustrated) as a dielectric material is formed between the first and the second electrodes. Also, a third transparent electrode 62 as a pixel electrode is formed extending over the TFT 3. Though not illustrated, the third transparent electrode 62 is electrically connected with the second transparent electrode 60 so that the holes produced in the photoconductive film may be accumulated in the storage capacitor (S), and is electrically connected also with the source electrode 33 via the source contact hole 54 so that the holes accumulated in the storage capacitor (S) may combine with electrons coming in through the TFT 3.

The principle of the above-described X-ray image detector can be summarized as follows. The holes produced from the photoconductive film (not illustrated) are gathered into the pixel electrode 62, then stored in the storage capacitor (S) through the second storage electrode 60 which is in connection with the pixel electrode 62 and operating as one electrode of the storage capacitor (S). If a signal is applied on the gate electrode of the TFT, the holes stored in the storage capacitor (S) are transferred to the drain electrode 32 via the pixel electrode 62 connected with the source electrode 33, then expressed as an image in an external circuit (not illustrated).

As illustrated in FIGS. 4a to 4h each of which is a cross-sectional view (IV–IV') of FIG. 3, the X-ray image detector according to the preferred embodiment is manufactured as described below.

Figure 4A:
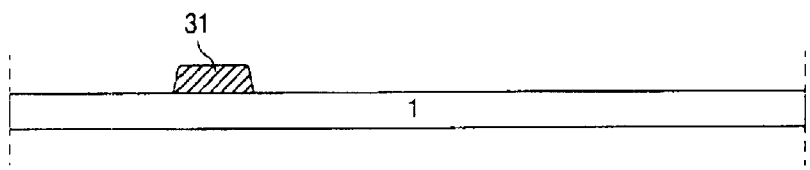
FIGS. 4a to 4h are cross-sectional views sequentially illustrating the manufacturing process of an X-ray image detector in accordance with one embodiment of the present invention and each view illustrates the cross-section IV–IV' of the FIG. 3.

A substrate 1 is deposited with a metal such as aluminum or aluminum alloy to form a first metal layer. A metal such as molybdenum (Mo), tantalum (Ta), tungsten (W), niobium (Nb) or antimony (Sb) can be used in the first metal layer. A gate electrode 31 with its cross-section having a tapered shape, is formed from of the first metal layer. (FIG. 4a)

Figure 4B:
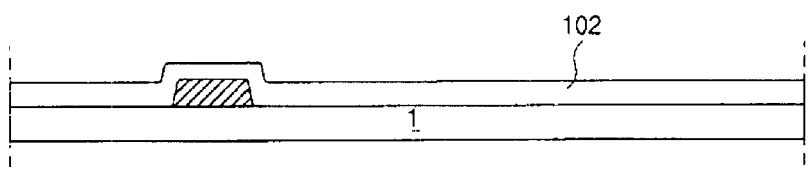

FIG. 4b illustrates the deposition step of a first insulation film. A gate insulation film 102 is formed by deposition of an inorganic insulation film such as a silicon nitride ($SiN_x$) film, or silicon oxide ($SiO_x$) film, or in some cases, by application of an organic insulation material such as BCB (benzocyclobutene) or acrylic resin. Preferably, deposition of a silicon nitride film is employed.

Figure 4C:
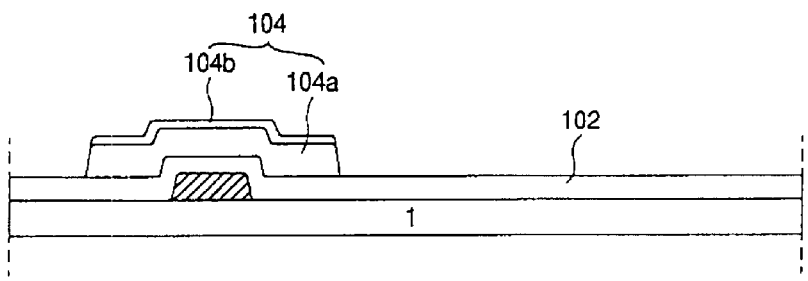

FIG. 4c illustrates the formation of a semiconductor layer 104 on the gate insulation film 102. A semiconductor film 104a, such as pure amorphous silicon film, and an impurity-added non-crystalline silicon film 104b are continuously deposited. Though either vapor deposition or ion injection can be used for the formation of the impurity-added non-crystalline silicon film 104b, vapour deposition is preferred.

Figure 4D:
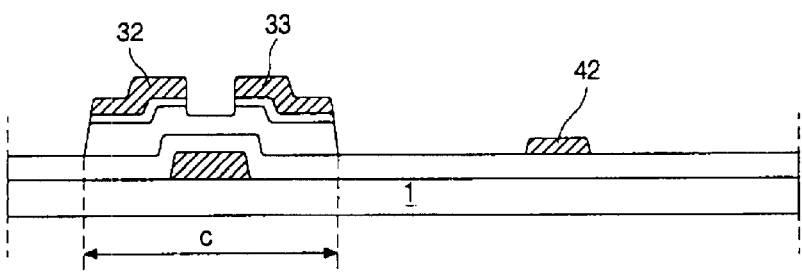

Next, a second metal layer is formed, i.e. source and drain electrodes 33, 32 and ground line 42. For this, a metal such as chromium (Cr) or a chromium alloy (Cr alloy) is deposited and patterned to form a source electrode 33, drain electrode 32 and ground line 42. Then, in the site which will become the channel of TFT, i.e. between the source electrode and drain electrode, the impurity-added non-crystalline silicon film 104b is removed by using the source/drain electrodes as a mask. The manufacture of TFT (C) as a switching element is now finished (FIG. 4d).

Figure 4E:
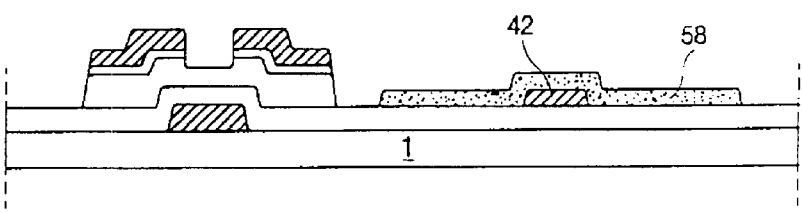

Next, as illustrated in FIG. 4e, a first storage electrode 58 is formed using a transparent electrode material such as ITO. The first storage electrode 58 is fabricated covering the ground line 42, and the ground line 42 performs the function to ground the residual electric charges remaining in the storage capacitor while the X-ray image detector is operating.

Figure 4F:
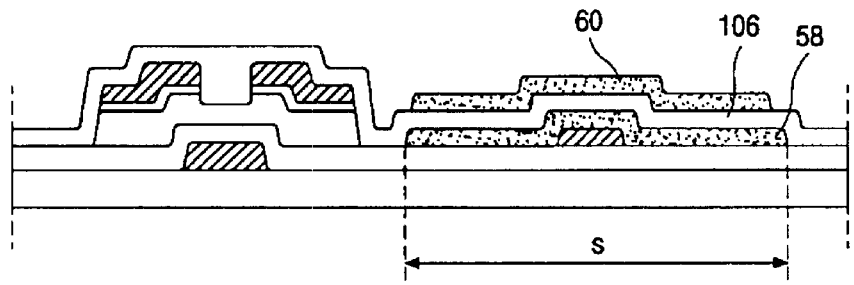

After the procedure, a silicon nitride film is deposited as a second insulation film on the source/drain electrodes 33, 32 and first storage electrode 58, thereby forming an insulating film 106 as a protection film for the TFT (C). The second insulation film 106 on the first storage electrode 58 functions as practical dielectric of the storage capacitor (S). Then, a second storage electrode 60, i.e. the second transparent electrode, is formed above the first storage electrode, in the same, or a little larger, size as the first storage electrode. (FIG. 4f).

Figure 4G:
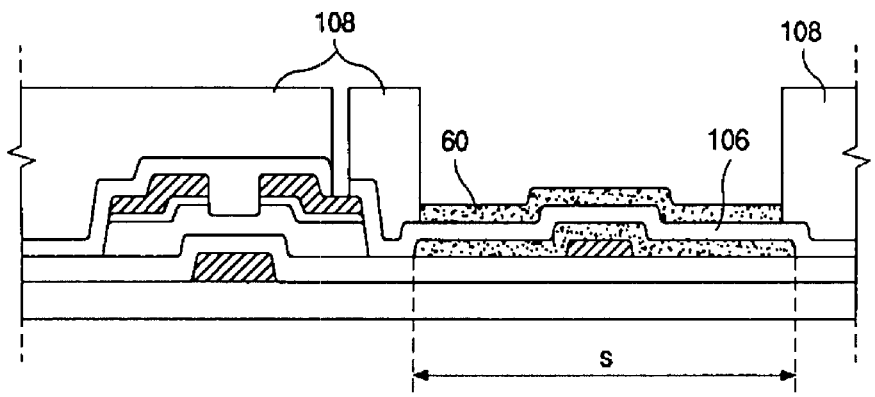

As shown in FIG. 4g, a protection film 108 is formed as a third insulating film. Organic benzocyclobutene (BCB) is preferably used. BCB is a material of a lower dielectric constant than the conventionally used silicon nitride, silicon oxide or acrylic resin. After the formation of protection film 108, a contact hole is formed such that part of the source electrode 33, and all of the second storage electrode 60, may be exposed. The second storage electrode 60 serves as a means to prevent the second insulation film 106 from being overetched while etching the protection film 108.

Figure 2:
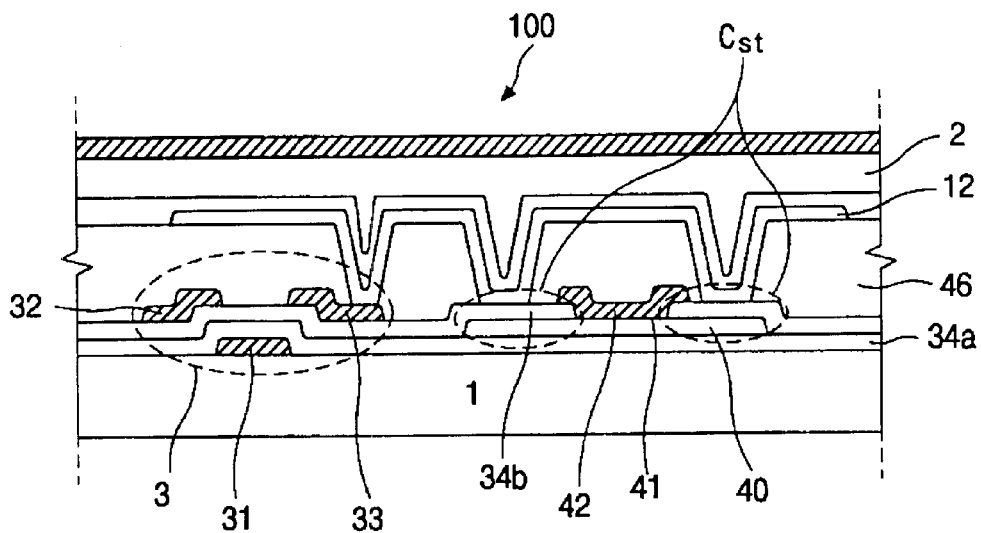
FIG. 2 is a sectional view illustrating a cross-section of one pixel of the conventional X-ray image detector.

Referring back to FIG. 2, which illustrates a cross-section of the conventional X-ray image detector, the insulation film as a dielectric is formed thickly for preventing overetching while etching out of the contact hole, which may cause point defects and reduce the capacitance of the storage capacitor. But, in a preferred embodiment of the present invention, the second storage electrode 60 is used as an etch-stopper, which enables that the capacity of storage capacitor (S) to be increased by reducing the thickness of the second insulation film 106, and minimizes occurrence of point defects by inhibiting the overetching of the second insulation film 106. From the illustration of FIG. 4g, it can be seen that the total surface of the second storage electrode 60 corresponds to the total capacity of the storage capacitor (S) and accordingly the capacity is increased compared to that of the conventional X-ray image detector, a cross-section of which is shown in FIG. 2.

Figure 4H:
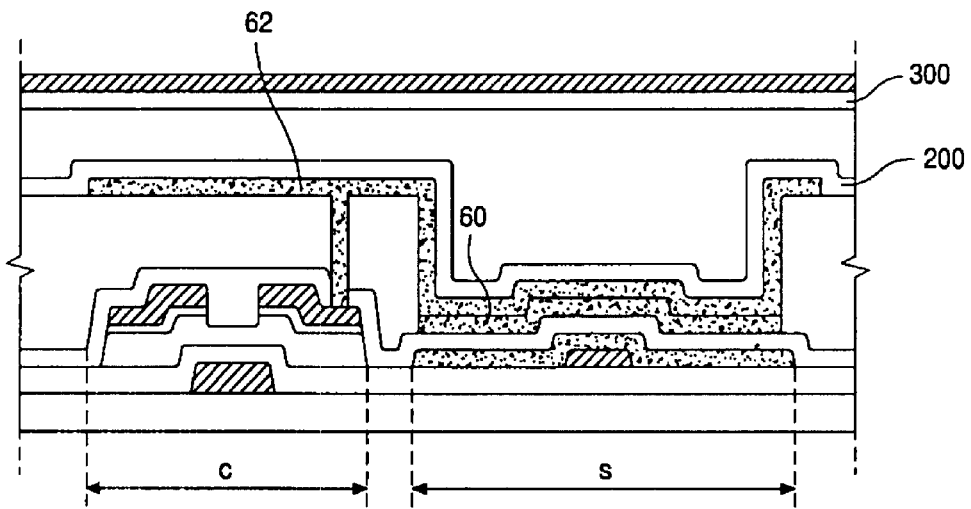

FIG. 4h illustrates the step to form a pixel electrode 62 as a third transparent electrode, in which the contact hole formed in the process of FIG. 4g is filled by deposition. Therefore, the pixel electrode 62 is made to electrically contact with the source electrode 33 and second storage electrode 60. In addition, the pixel electrode 62 is formed extended to cover the upper part of TFT to constitute a "mushroom" structure.

Though not illustrated, in a next step a photosensitive material is applied to be used as converter to receive an external signal and convert it to an electric signal. A non-crystalline selenium compound is deposited in a thickness of 100 to 500 $\mu$m by an evaporator. An X-ray sensitive material, for example $HgI_2$, $PbO_2$, CdTe, CdSe, thallium bromide and cadmium sulfide, having low dark conductivity and high sensitivity to external signals, in particular high X-ray photoconductivity, can be used as well. When a photosensitive material is exposed to X-ray energy, pairs of electrons and holes are produced in the photosensitive material in accordance with the strength of the irradiated light.

After the application of the X-ray-sensitive material, a conductive electrode that transmits X-ray energy is formed. When a voltage is applied on the conductive electrode while being irradiated by X-ray energy, the pairs of electron and hole formed in the photosensitive material are separated into electrons and holes, and the holes separated by the conductive electrode are gathered to the pixel electrode 62 and stored in the storage capacitor (S).

According to the present invention, the following advantages are obtained. By forming a two-layered protection film of silicon nitride and BCB on the channel portion of the TFT, charges produced by X-ray energy can be prevented from being induced to the channel of the TFT. Also, due to the second storage electrode preventing etching out of the dielectric in the storage capacitor, the silicon nitride film may have a reduced thickness, leading to an increase of electric charges stored in the storage capacitor. An X-ray image detector according to the present invention can be manufactured by using a TFT array process already used, no other special facilities are required. Electrical shorts occurring between first and second storage electrodes, a cause of point defects, are inhibited by preventing overetching of the dielectric through use of the second storage electrode as an etch-stopper.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. An X-ray image detector, comprising:
   a photoelectric conversion part producing electric charges in accordance with a received amount of X-ray energy;
   a storage capacitor having a first storage electrode, a dielectric layer deposited on the first storage electrode, a second storage electrode on the dielectric layer, and a pixel electrode in contact with a total upper surface of the second storage electrode, and collecting the electric charges produced in the photoelectric conversion part; and
   a switching part controlling release of the electric charges stored in the storage capacitor.

2. The X-ray image detector of claim 1, wherein the charge storage part further comprises a ground line contacting the first storage electrode.

3. The X-ray image detector of claim 2, wherein the ground line is disposed beneath the first storage electrode.

4. The X-ray image detector of claim 1, wherein the photoelectric conversion part further comprises a photoconductive film and a conductive electrode.

5. An X-ray image detector, comprising:
   a substrate;
   a gate electrode formed on the substrate;
   a first insulation film formed on the substrate and gate electrode;
   a first storage electrode formed on a predetermined position of the first insulation film;
   an active layer formed on the first insulation film on the gate electrode;
   a source and drain electrode formed on the active layer;
   a second insulation film formed on the source and drain electrodes and first storage electrode and having a source contact hole exposing a portion of the source electrode;
   a second storage electrode formed on the second insulation film on the first storage electrode;
   a third insulation film covering the second insulating film, except for the second storage electrode and a source contact hole exposing an exposed portion of the source electrode; and
   a pixel electrode formed on the second storage electrode, the third insulation film, and the exposed portion of the source electrode.

6. The X-ray image detector of claim 5, wherein the third insulation film is an organic insulation film.

7. The X-ray image detector of claim 6, wherein the organic insulation film is a material selected from a group consisting of BCB (benzocyclobutene), acrylic resin and polyimide.

8. The X-ray image detector of claim 5, wherein a ground line is formed between the first storage electrode and the first insulation film.

9. The X-ray image detector of claim 5, wherein the pixel electrode extends onto the third insulation film on the active layer.

10. A method for fabricating an X-ray image detector, comprising:

forming a gate electrode on a substrate;

forming a first insulation film on the substrate and gate electrode;

forming an active layer on the first insulation film on the gate electrode;

forming a source electrode and drain electrode on the active layer, and forming a ground line at a predetermined position on the first insulation film;

forming a first storage electrode which covers the ground line;

forming a second insulation film on the first storage electrode, source electrode and drain electrode;

forming a second storage electrode on the second insulation film on the first storage electrode;

depositing an organic insulation film covering the second insulation film and second storage electrode;

patterning the organic insulation film and the second insulation film to expose a portion of the source electrode, and the total second storage electrode;

forming a pixel electrode on the patterned organic insulation film, in contact with the source electrode and the second storage electrode;

forming a photoconductive film on the pixel electrode; and forming a conductive electrode on the photoconductive film.

11. The method of claim 10, wherein the photoconductive film is a material selected from a group consisting of PbO, CdTe, $HgI_2$ and CdSe.

12. The method of claim 10, wherein the organic insulation film is formed of a material selected from a group consisting of BCB (benzocyclobutene), acrylic resin and polyimide.

13. The method of claim 10, wherein the pixel electrode is formed extending onto the organic insulation film on the active layer.

14. An X-ray image detector which comprising:

a photoelectric conversion layer producing electric charges in accordance with a received amount of X-ray energy;

a ground line;

a storage capacitor formed above the ground line, the storage capacitor having a first storage electrode formed above and in contact with the ground line, a dielectric layer deposited on the first storage electrode, and a second storage electrode formed on the dielectric layer, the storage capacitor for collecting the electric charges produced in the photoelectric conversion layer;

a switching device controlling release of the electric charges stored in the storage capacitor; and a pixel electrode formed above and in contact with an upper surface of the second storage electrode, wherein the pixel electrode covers the entire upper surface of the second storage electrode.

15. The X-ray image detector of claim 14, wherein the switching device is a thin film transistor (TFT).

16. The X-ray image detector of claim 15, wherein the pixel electrode contacts a source electrode of the TFT.

17. The X-ray image detector of claim 16, wherein the dielectric layer covers the TFT, and wherein the pixel electrode contacts the source electrode via a contact hole formed in the dielectric layer.

* * * * *